(12) United States Patent
Zaderej

(10) Patent No.: US 8,690,389 B2
(45) Date of Patent: Apr. 8, 2014

(54) ILLUMINATION MODULE

(75) Inventor: Victor Zaderej, St. Charles, IL (US)

(73) Assignee: Molex Incorporated, Lisle, IL (US)

( * ) Notice: Subject to any disclaimer, the term of this patent is extended or adjusted under 35 U.S.C. 154(b) by 18 days.

(21) Appl. No.: 13/469,831

(22) Filed: May 11, 2012

(65) Prior Publication Data

US 2012/0293997 A1 Nov. 22, 2012

Related U.S. Application Data

(60) Provisional application No. 61/486,542, filed on May 16, 2011.

(51) Int. Cl.
*F21S 4/00* (2006.01)
(52) U.S. Cl.
USPC .. 362/249.02; 362/235; 362/294; 439/620.02
(58) Field of Classification Search
USPC ................. 362/249.02, 235, 294; 439/620.02
See application file for complete search history.

(56) References Cited

U.S. PATENT DOCUMENTS

| | | | | |
|---|---|---|---|---|
| 6,824,294 | B2 * | 11/2004 | Cao | 362/231 |
| 7,992,294 | B2 * | 8/2011 | Zaderej et al. | 29/846 |
| 8,197,097 | B2 | 6/2012 | Ogawa et al. | |
| 2008/0310167 | A1 * | 12/2008 | Zaderej et al. | 362/294 |
| 2009/0237928 | A1 * | 9/2009 | Dubuc | 362/235 |
| 2010/0046223 | A1 * | 2/2010 | Li et al. | 362/249.02 |
| 2012/0002419 | A1 * | 1/2012 | Zaderej et al. | 362/249.02 |
| 2012/0106177 | A1 | 5/2012 | Blankestijn et al. | |
| 2012/0224375 | A1 * | 9/2012 | Zaderej et al. | 362/249.02 |
| 2013/0044485 | A1 * | 2/2013 | Zaderej et al. | 362/249.02 |
| 2013/0051009 | A1 * | 2/2013 | Zaderej et al. | 362/235 |
| 2013/0084748 | A1 * | 4/2013 | Zaderej et al. | 439/620.02 |

FOREIGN PATENT DOCUMENTS

| | | |
|---|---|---|
| JP | 08-312585 | 11/1996 |
| JP | 2008-218504 | 9/2008 |
| JP | 2009-105016 | 5/2009 |
| JP | 2012-182191 | 9/2012 |

* cited by examiner

*Primary Examiner* — Mary Ellen Bowman
(74) *Attorney, Agent, or Firm* — Stephen L. Sheldon

(57) ABSTRACT

A light emitting diode (LED) module is provided that includes a base and a cover. Circuitry is provided on the base. An LED array is provided on the base and is coupled to the circuitry, which in an embodiment may convert AC line voltage to DC voltage. The LED module can be configured to take up minimal space while providing desirable light output.

14 Claims, 16 Drawing Sheets

US 8,690,389 B2

ILLUMINATION MODULE

RELATED APPLICATIONS

This applications claims priority to U.S. Provisional Application No. 61/486,542, filed May 16, 2011, which is incorporated herein by reference in its entirety.

FIELD OF THE INVENTION

The present invention relates to field of lighting using a light emitting diode (LED), more specifically to the field of modular LED-based solutions.

DESCRIPTION OF RELATED ART

The efficiency of the light emitting diode (LED) has been substantially increased over the past decade and consequentially, LEDs are known to be suitable for using in providing general illumination. One issue that exists, however, is packaging LEDs. LEDs, while efficient, require careful thermal management to avoid negatively impacting the potential long life that would otherwise be possible. In addition, as LEDs require current in one direction to function, AC voltage needs to be converted to DC voltage (at least effectively converted). Furthermore, it would be beneficial to provide a LED module in a small package size. Emitters have been used as they consist of a single LED chip but such devices tend to be limited in the amount of light output (typically less than 200 lumens). To provide more lumens, reasonably compact devices such the device depicted in FIG. 1 have been proposed. However, these devices still require DC voltage and usually are constructed (often they use metal clad PCB base) such that they are incompatible with line voltage requirements. Thus, existing designs fail to provide a compact, high light output system that would be compatible with AC line voltage. Therefore, certain individuals would appreciate an improved LED module.

BRIEF SUMMARY

A light emitting diode (LED) module is provided that includes a base and a cover. Circuitry is provided on the base. An LED array is provided on the base and is electrically connected to the circuitry, which in an embodiment may convert AC line voltage to DC voltage. The cover can include a non-reflective angled surface that is designed to have minimal impact on the shape of light emitted from the LED array.

BRIEF DESCRIPTION OF THE DRAWINGS

The present invention is illustrated by way of example and not limited in the accompanying figures in which like reference numerals indicate similar elements and in which.

DETAILED DESCRIPTION

Figure 1:
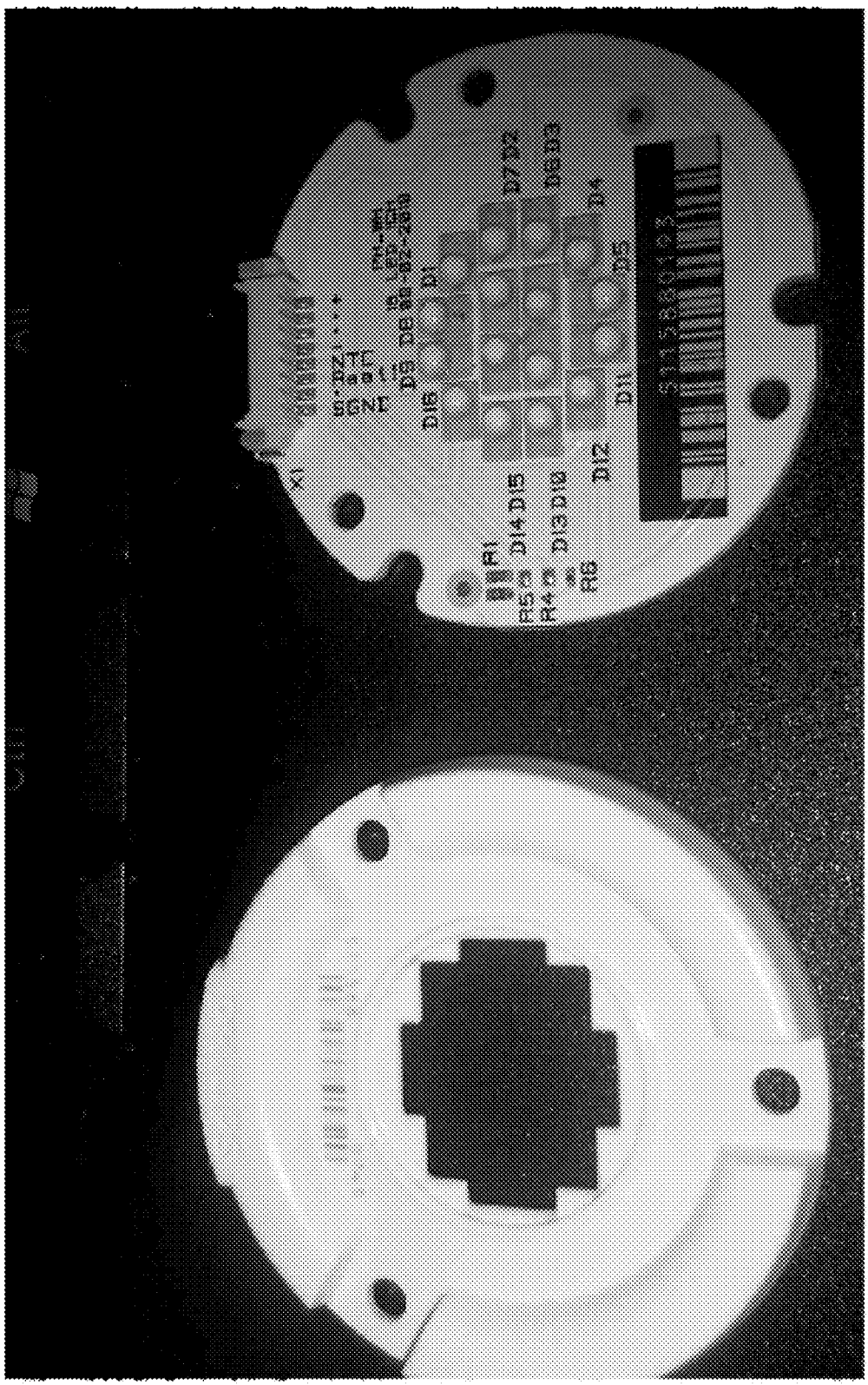
FIG. 1 illustrates a prior art lighting system.
Figure 2A:
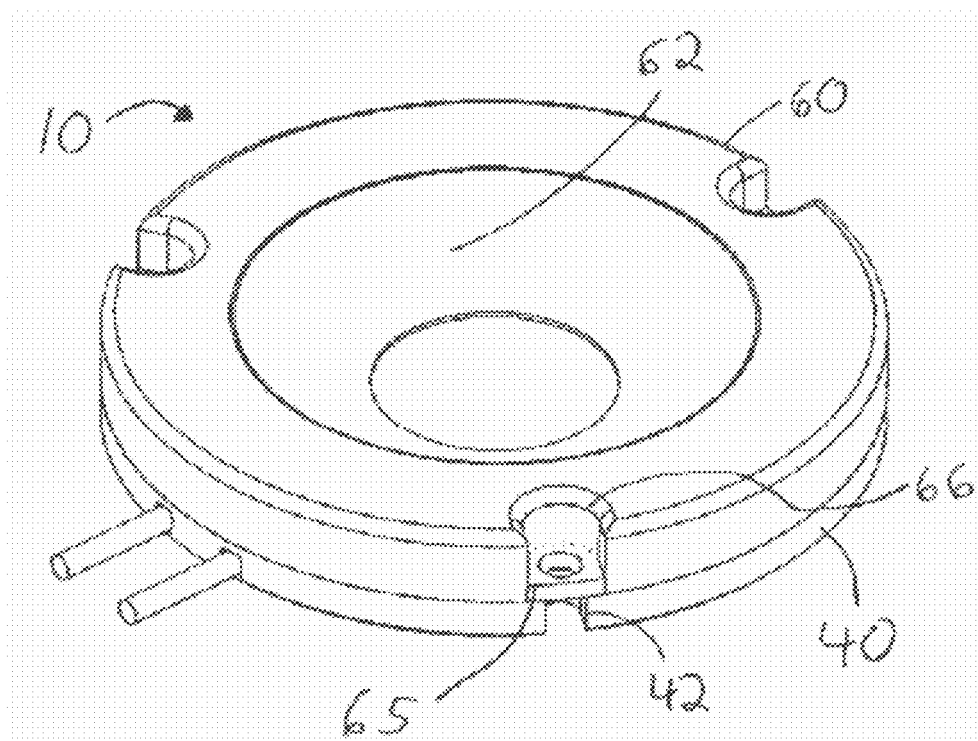
FIG. 2A illustrates a perspective view of an embodiment of an LED module.
Figure 2B:
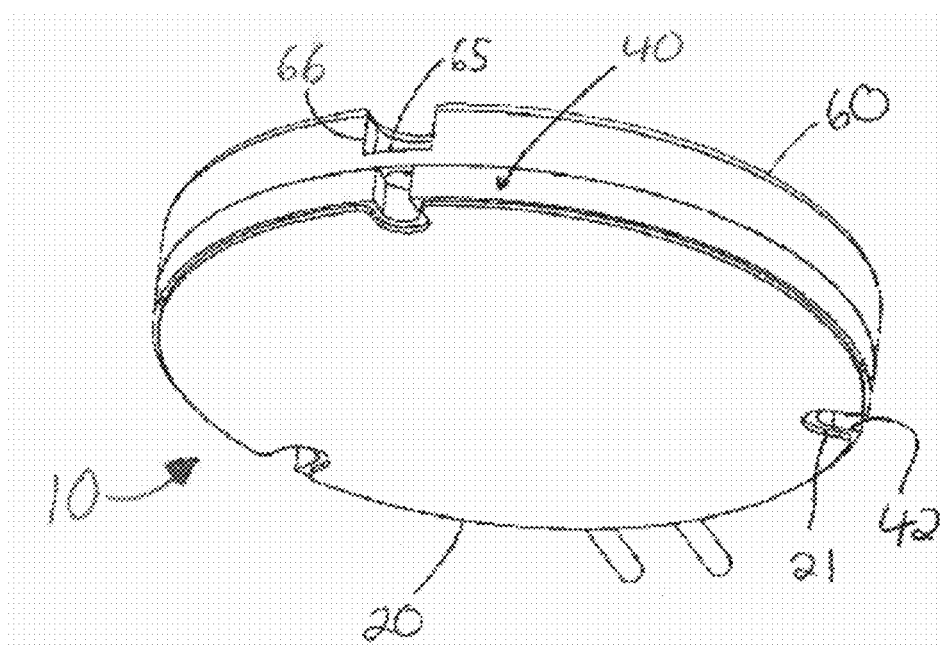
FIG. 2B illustrates another perspective view of the LED module depicted in FIG. 2A.
Figure 3:
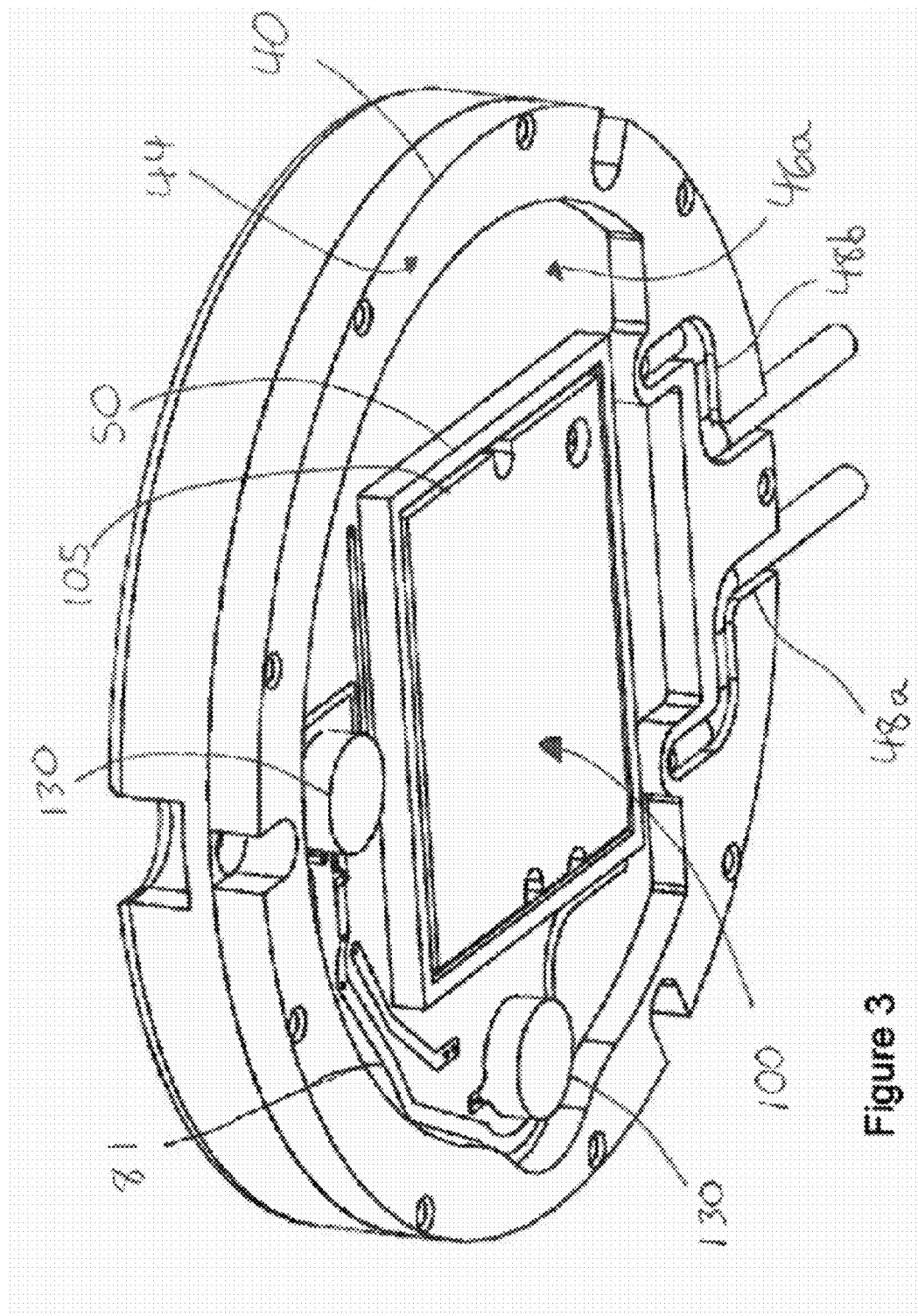
FIG. 3 illustrates a perspective view of an LED module with a thermal pad removed.
Figure 4:
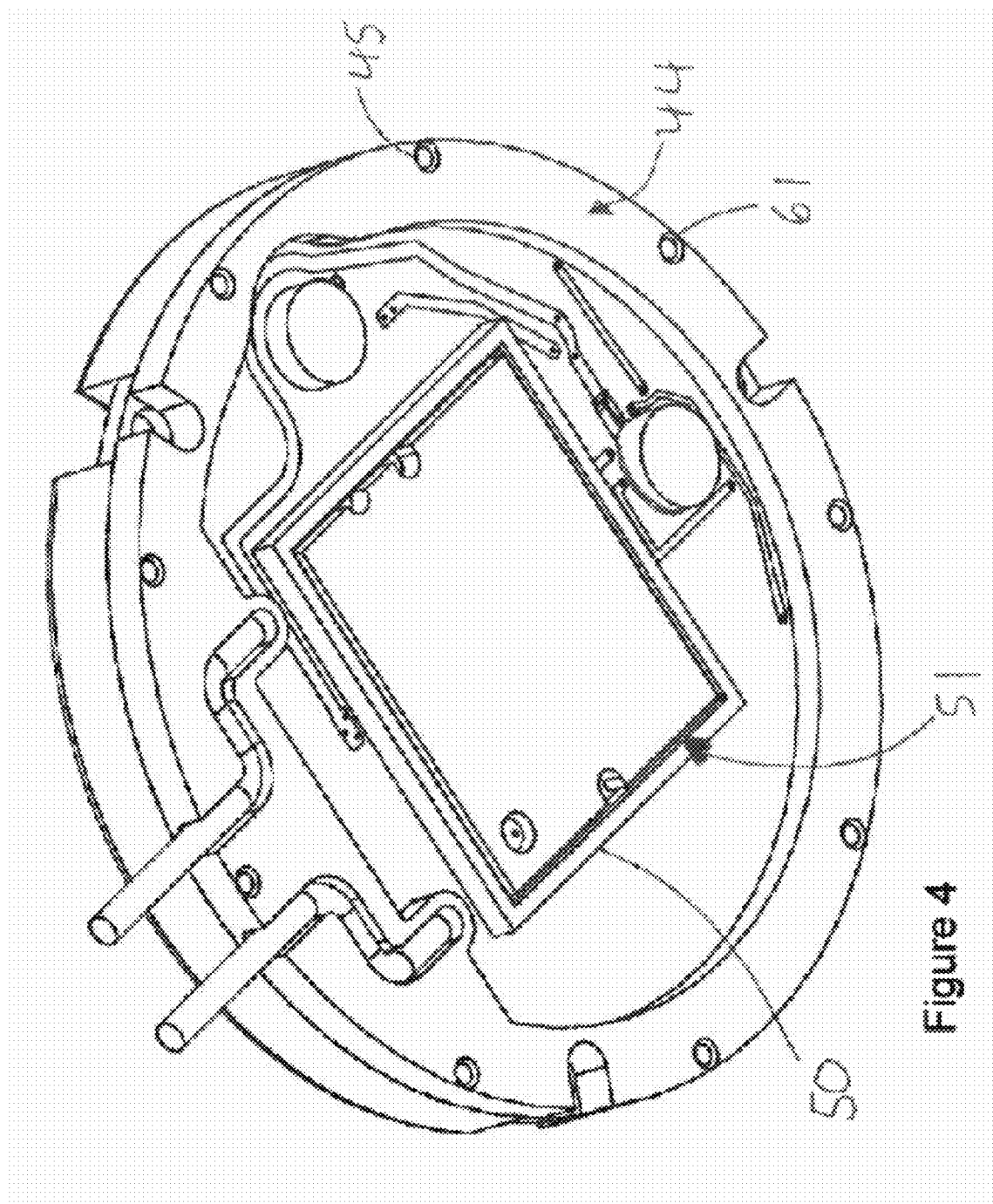
FIG. 4 illustrates another perspective view of the LED module depicted in FIG. 3.
Figure 5:
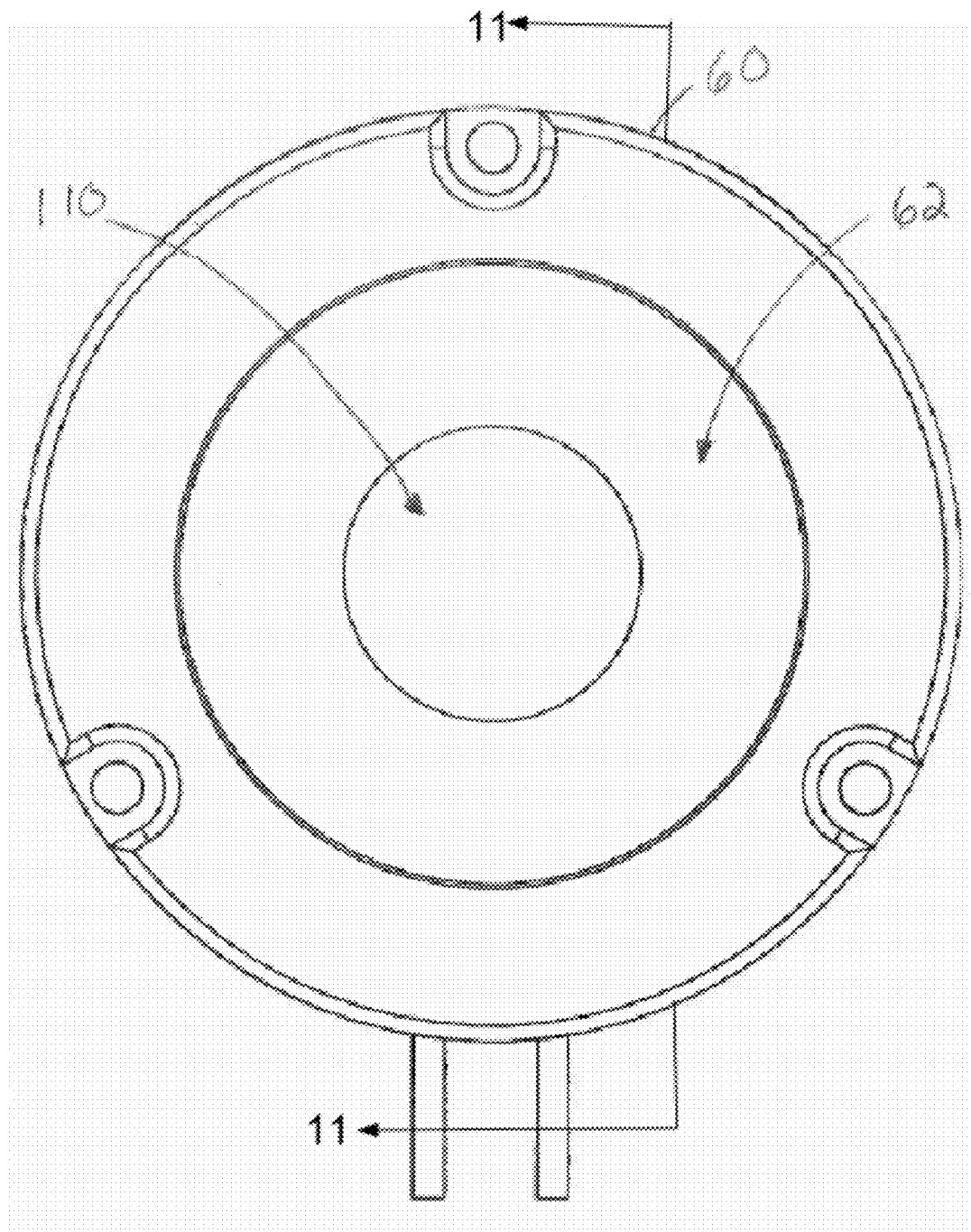
FIG. 5 illustrates a plan view of an embodiment of an LED module.
Figure 6:
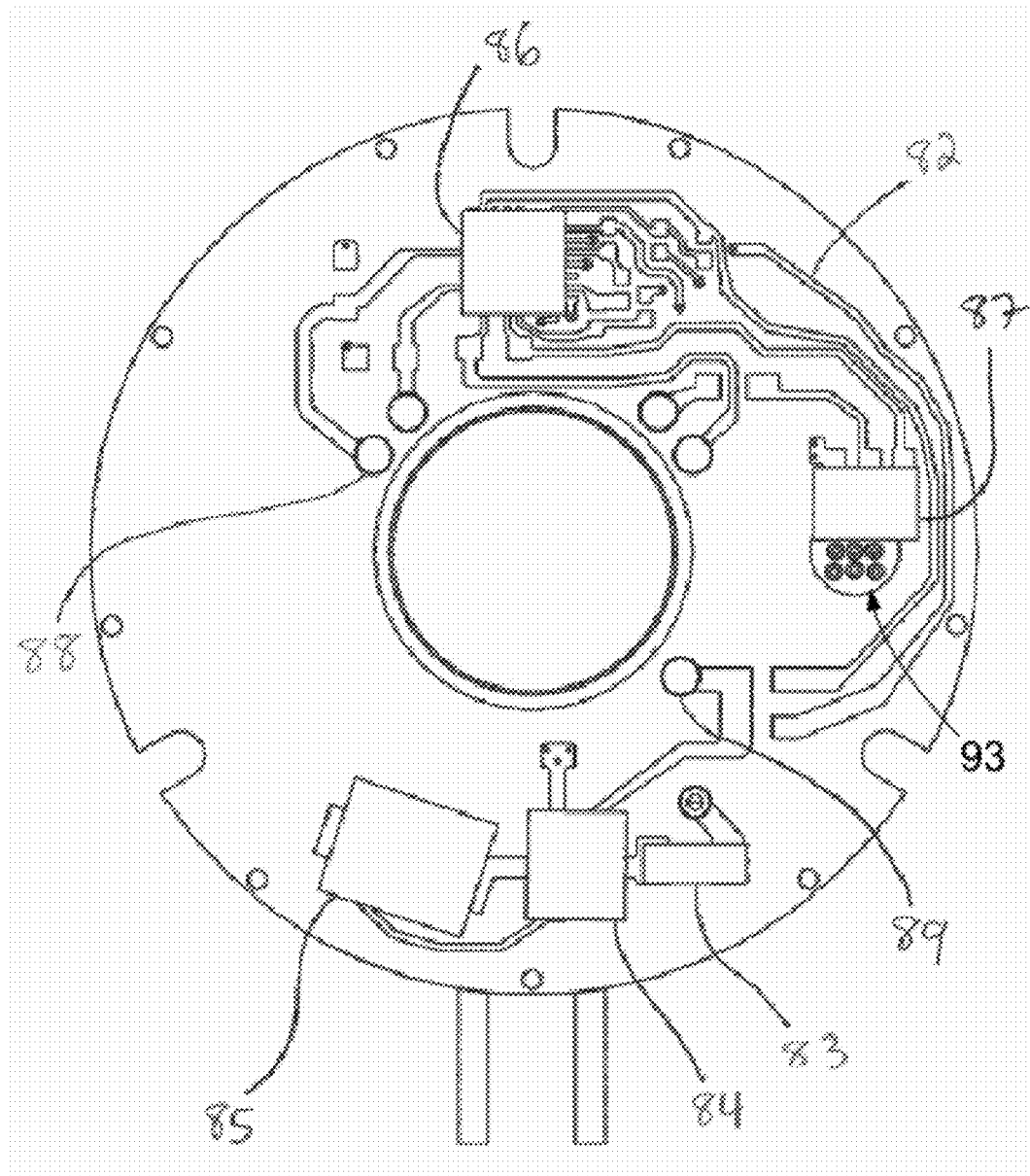
FIG. 6 illustrates a plan view of an embodiment of an LED module with a cover removed.
Figure 7:
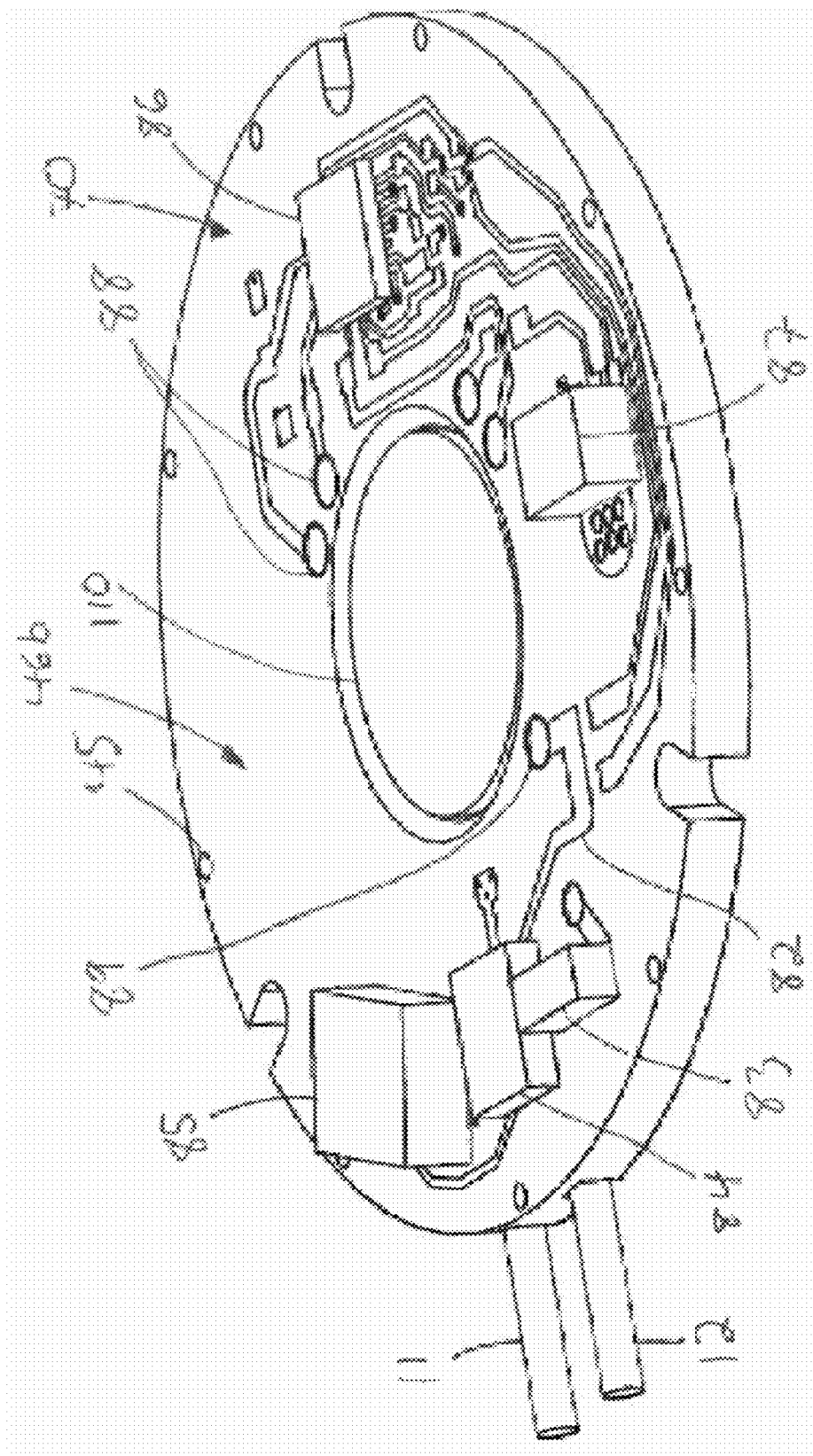
FIG. 7 illustrates a perspective view of the embodiment depicted in FIG. 6.
Figure 8:
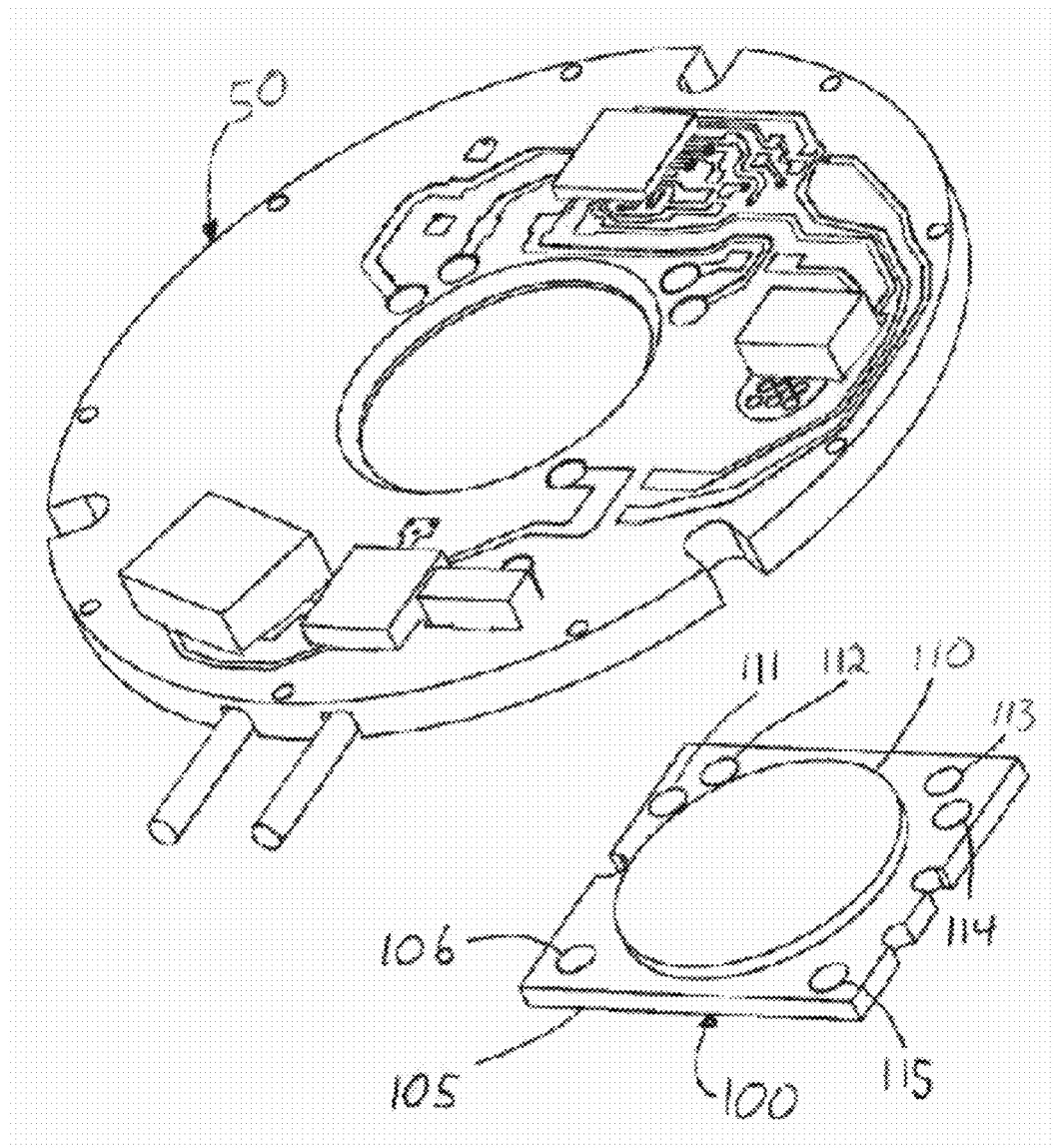
FIG. 8 illustrates a perspective partially exploded view of the embodiment depicted in FIG. 7.
Figure 9:
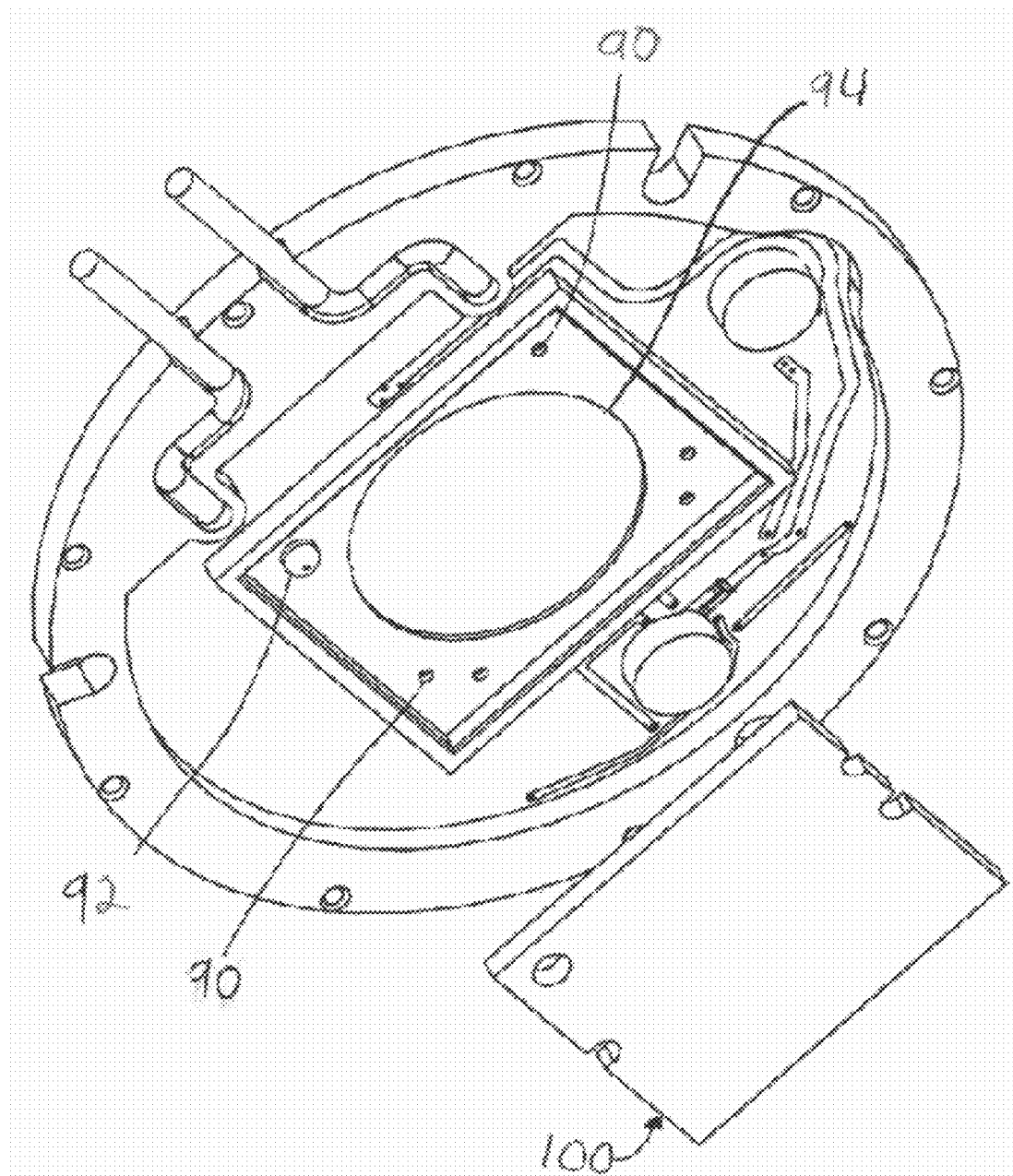
FIG. 9 illustrates another perspective partially exploded view of the embodiment depicted in FIG. 7.
Figure 10:
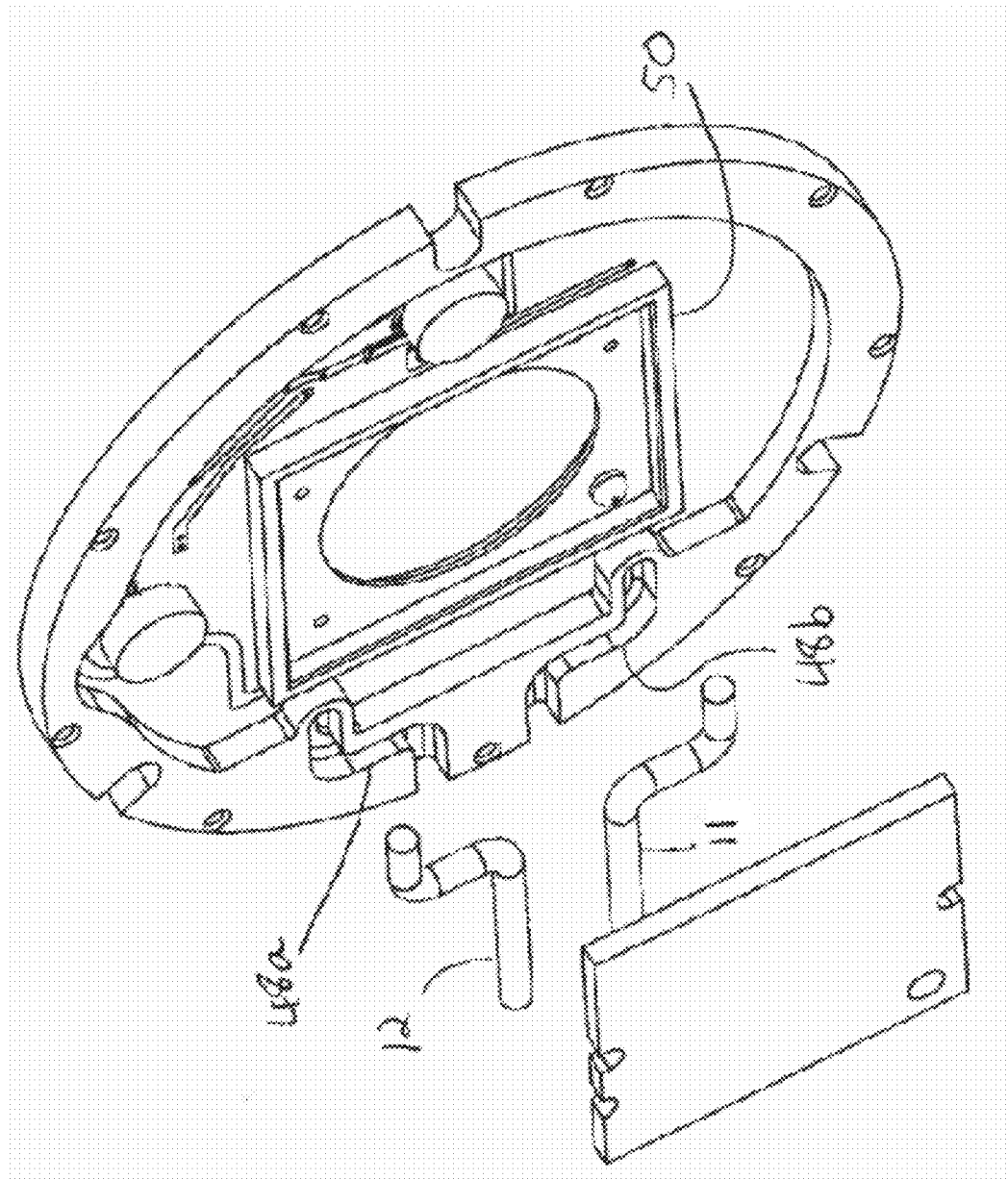
FIG. 10 illustrates another perspective partially exploded view of the embodiment depicted in FIG. 7.
Figure 11:
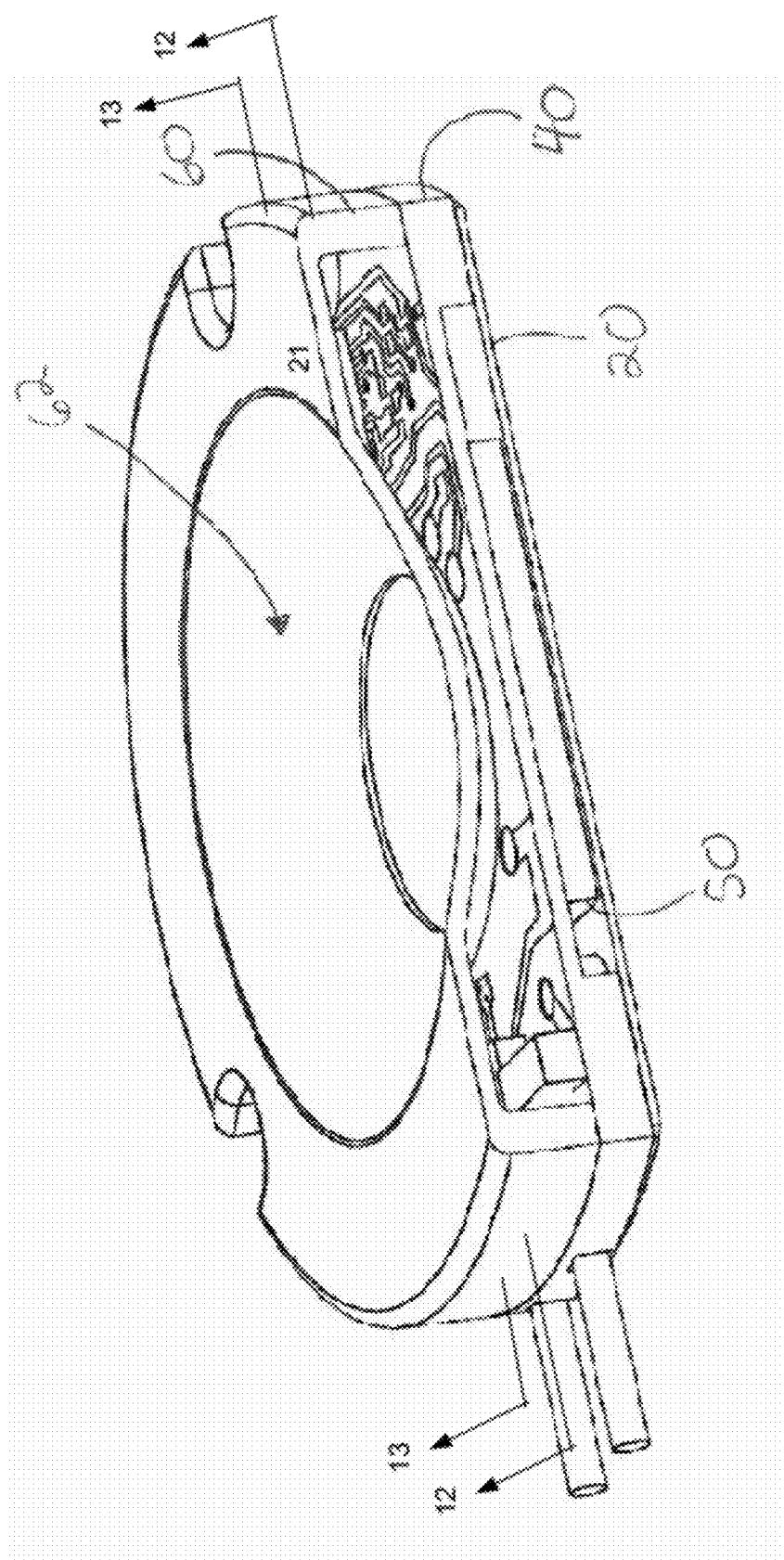
FIG. 11 illustrates a perspective view of a cross section of the LED module depicted in FIG. 6, taken along line 11-11.
Figure 12:
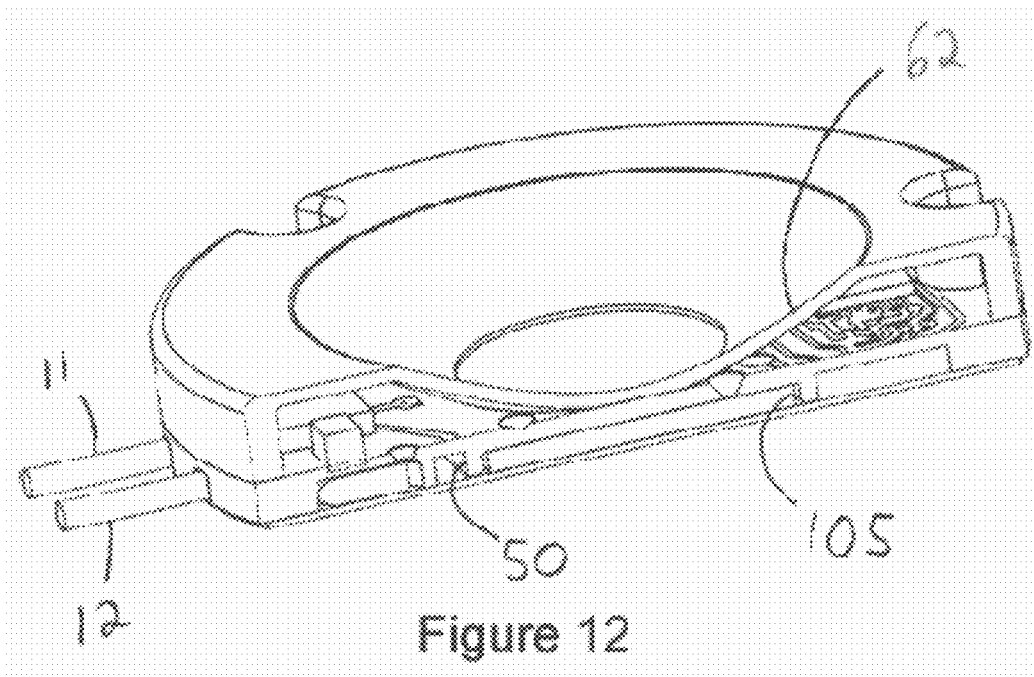
FIG. 12 illustrates a perspective view of another cross section of the LED module depicted in FIG. 11, taken along line 12-12.
Figure 13:
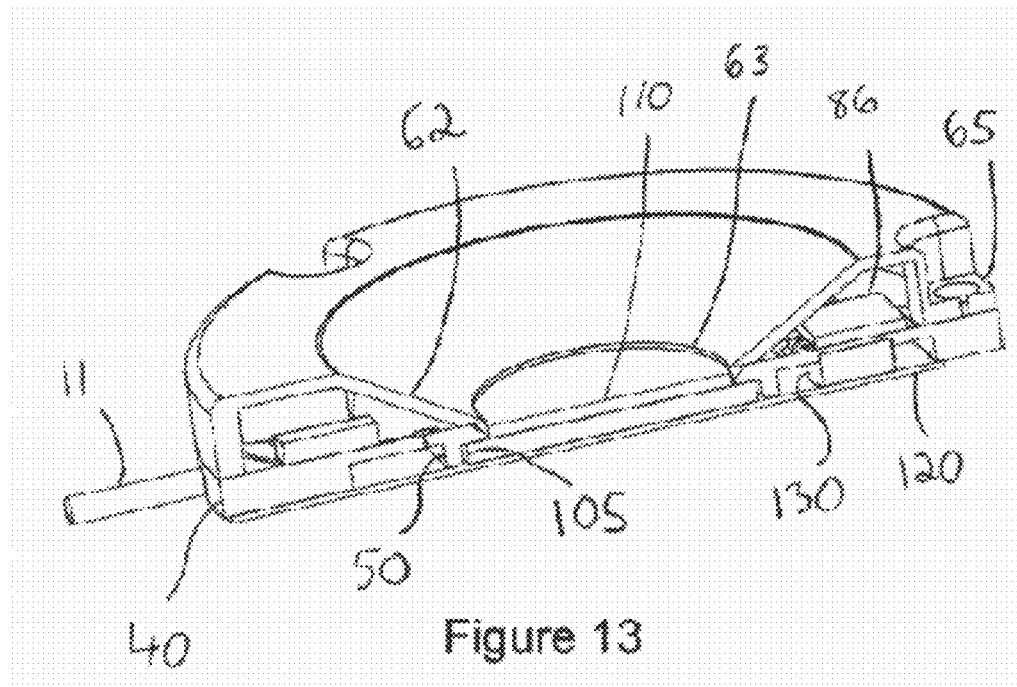
FIG. 13 illustrates a perspective view of another cross section of the LED module depicted in FIG. 11, taken along line 13-13.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

FIGS. 2A-13 illustrate embodiments of a LED module. One beneficial feature of the depicted design is that a cover 60 is provided with an angled surface 62 that acts substantially as a non-reflective surface. In other words, an LED array 100 has a light block 110 that provides the illumination and extends through aperture 94 in base 40 and the angled surface 62 is designed to substantially not shape the light emitted from the light block 110. Thus, if the light block 110 naturally provides a distribution of about 60 or 90 or 110 or some other angle, then the angled surface would be configured to be at that corresponding angle or at a slightly greater angle. In general, the angled surface of a non-reflective surface can be configured to reflect less than 10 percent of the light being emitted and preferably will reflect less than 5 percent of the light being emitted.

Of course, as can be readily appreciated, the cover could also include a reflector and/or lens that purposefully shapes the light. In such a configuration, the cover would not have a non-reflective angled surface but could otherwise provide other benefits discussed herein. In addition with a cover that shapes the light (e.g., focuses the light) or that includes a simple transparent lens, it would be possible to provide a LED module that would be considered touch-safe.

As can be appreciated, the LED module includes a base 40 that supports the LED array 100. The base 40 can further support circuitry that converts AC voltage to DC voltage. As depicted, for example, the base 40 allows for AC line voltage (e.g., 110 VAC) input via conductors 11, 12 and converts the AC voltage to DC voltage so that the LEDs provided by the light block 110 can be powered in an effective manner. The depicted embodiment includes a fuse 83, a rectifier 84, a voltage surge suppressor 85, and a controller 86 that actuates a MOSFET power source 87. The depicted configuration has multiple taps 88 on the base 40 that are used to selectively power pads 111, 112, 113, and 114 of the LED array 100 and each of the pads is coupled to a series of LEDs in the light block 110. By selective powering of the different series of LEDs it is possible to provide illumination that is flicker-free to a user's eyes (e.g., any flicker present is not perceptible to a user). Chips that can provide this type of control include designs such as is provided by EXCLARA's EXC100 driver. Thus, the depicted design allows for efficient use of AC voltage and to provide substantially constant illumination to the user's eyes in spite of the fact that AC voltage fluctuates. Therefore, the depicted configuration provides pleasing illumination without noticeable flicker but does not require capacitors (which tend to be a failure point for any long-lasting system). Of course, the addition of capacitors can further optimize the performance of the system and may be useful for situation where dimming capabilities are desired but if provided, the capacitors could be smaller in size and more robust in design (for example, ceramic capacitors could be used in certain embodiments or the capacitors could be better cooled), thus still providing high durability and lower costs. In addition, the depicted system is suitable for manufacture in processes that utilizes wave solder techniques.

It should be noted, however, that a more conventional capacitor based power conversion system could be used if desired. Such a power conversion system (which would include a rectifier and a larger capacitor to stabilize the output) is more conventional and thus need not be discussed in detail herein as a large number of possible variations are available, it being understood that such a system would be larger in size than might otherwise be desirable One benefit of the depicted design is that the base 40 is an insulative material that provides both structure rigidity and also supports circuitry 70 (which provides the desired control such as conversion from AC to DC). As can be appreciated, traces 81, 82 provided on base 40 can electrically connect the various components. In an embodiment, the base 40 can be a plateable plastic and the traces can be provided via a known conventional LDS process. One benefit of the depicted design is that the base can be configured to be about 60 mm in diameter while the combination of the base and the cover can be about 10 mm high. Thus, the volume of the LED module can be less than 35,000 mm$^3$ while still providing greater than 500 lumens of output and also provide AC to DC conversion. In an embodiment the input AC voltage can be AC line voltage (e.g., 110 volts). And with the depicted embodiment, the volume can be less than 30,000 mm$^3$ while substantially avoiding light shaping due to the use of the non-reflective cover. Thus the depicted embodiment provides substantial benefits as compared to existing LED modules.

To provide appropriate thermal performance for a system that is cable of emitting more than 500 lumens and in embodiments can emit more than 700 or even more than 1000 lumens, the LED array 100 includes a substrate 105 that has low thermal resistance. In addition, a thermal pad 20 is positioned on a flange 44 that extends along a circumference and on a bottom of the base 40 and provides a thermal connection between the substrate 105 and a support surface. In an embodiment, the flange 44 and the substrate 105 can be configured so that both have a bottom surface on the same plane. Thus, the thermal resistance between the LED chips and the support surface on which the LED module mounts can be kept below 2 C/W and preferably below 1 C/W.

The thermal pad 20 is preferably electrically insulative but thermally conductive and thus, in combination with the cover and the base, forms a pocket of insulative material around the components provided on the base 40. While the LED array 100 is configured to be positioned in a socket 50 that is in communication with the aperture 94, the substrate 105 extends below the socket 50 so as to ensure good thermal connection to the thermal pad 20. If desired, one or more heat pucks 130 can be provided on the bottom side of the base 40 and the heat pucks 130 can be in thermal communication with components positioned on the top side of the base 40 via thermal vias 93. Thus, thermal management of the entire system is possible while ensuring desirable electrical isolation so that an AC compatible LED module with the desired size requirements can be provided.

Figure 14:
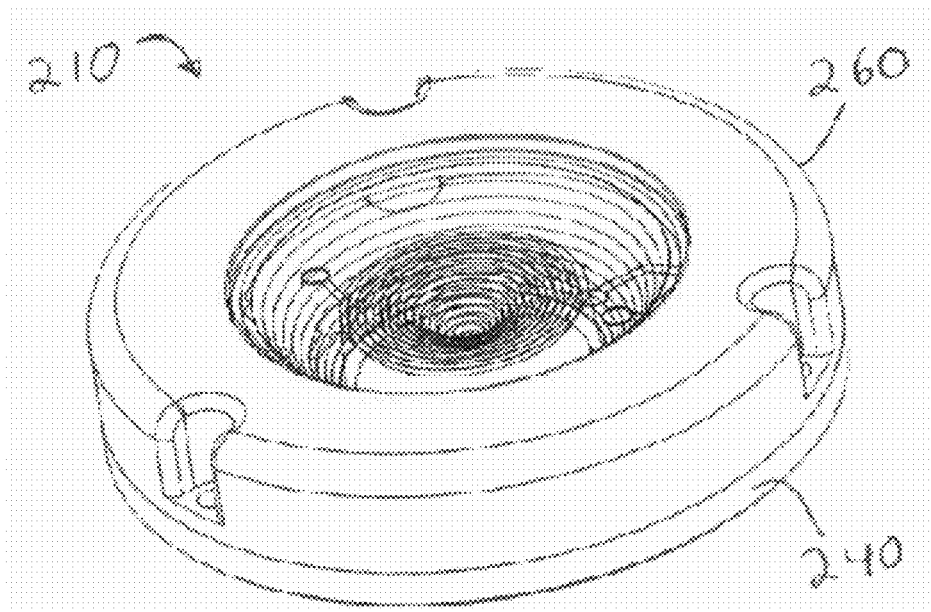
FIG. 14 illustrates a perspective view of another embodiment of an LED module.
Figure 15:
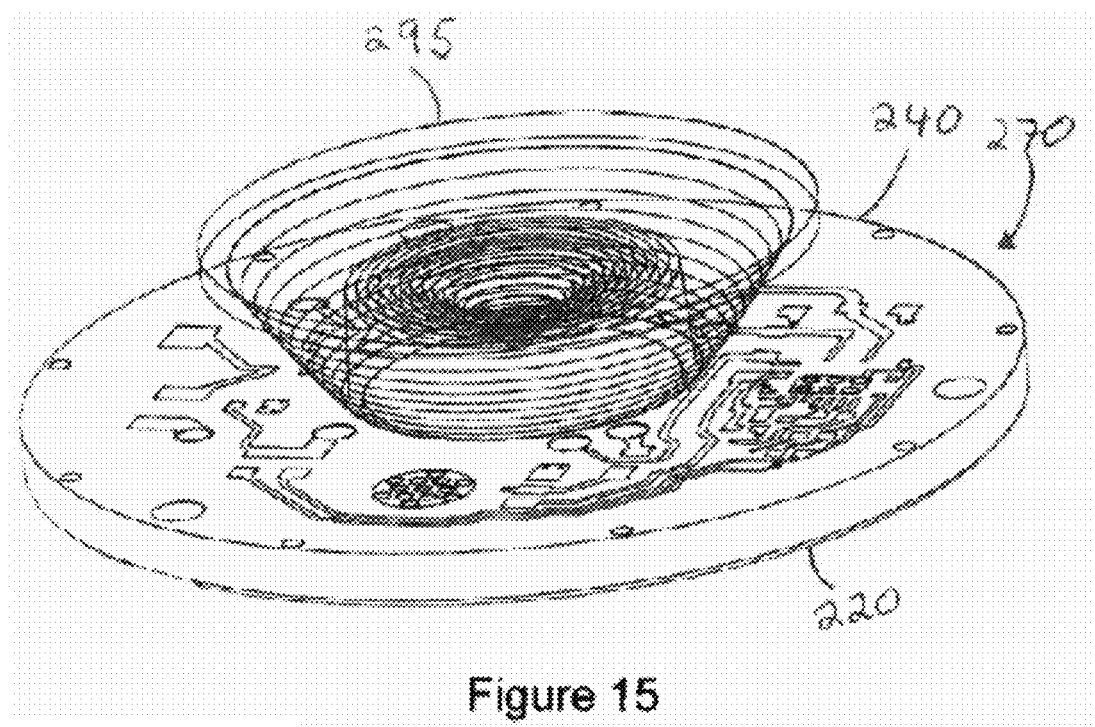
FIG. 15 illustrates a perspective view of the LED module depicted in FIG. 14 with the cover omitted.
Figure 16:
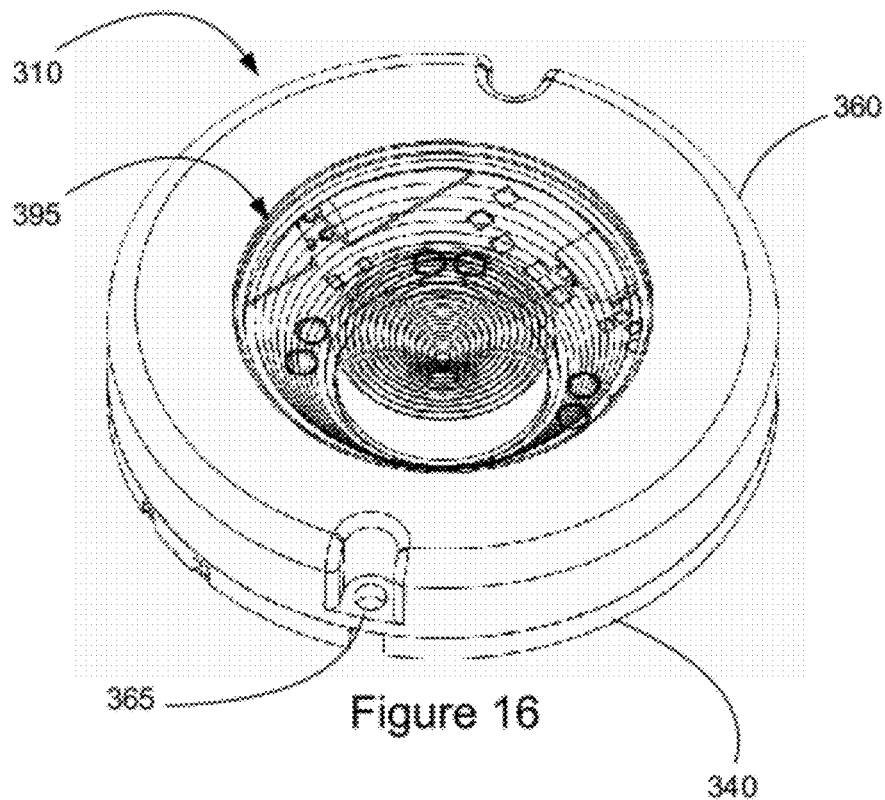
FIG. 16 illustrates a perspective view of an embodiment of an LED module.
Figure 17:
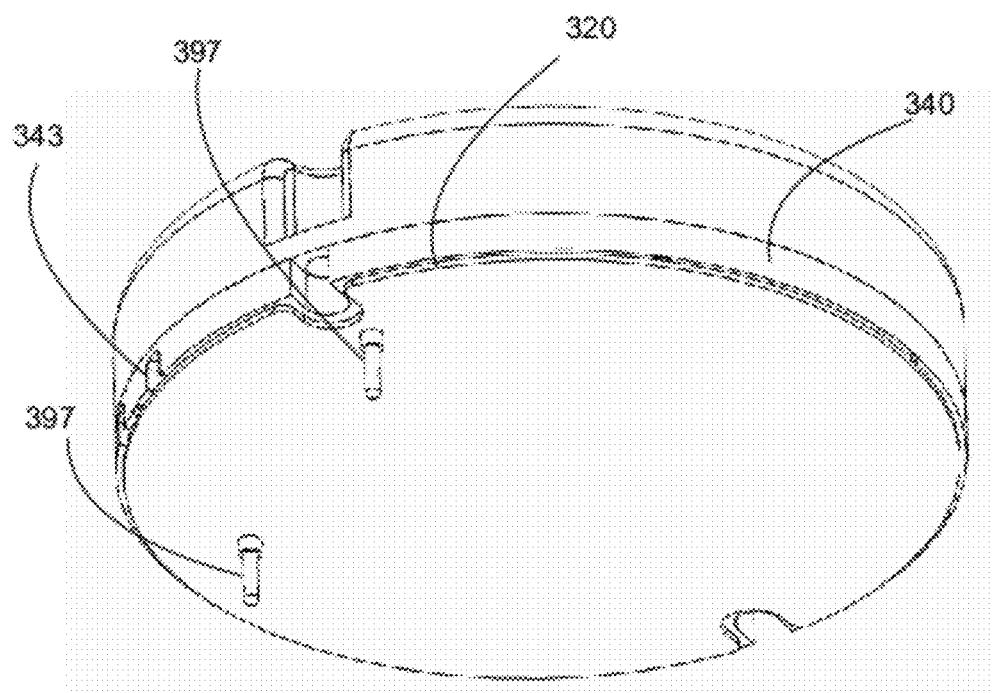
FIG. 17 illustrates another perspective view of the LED module depicted in FIG. 16.
Figure 18:
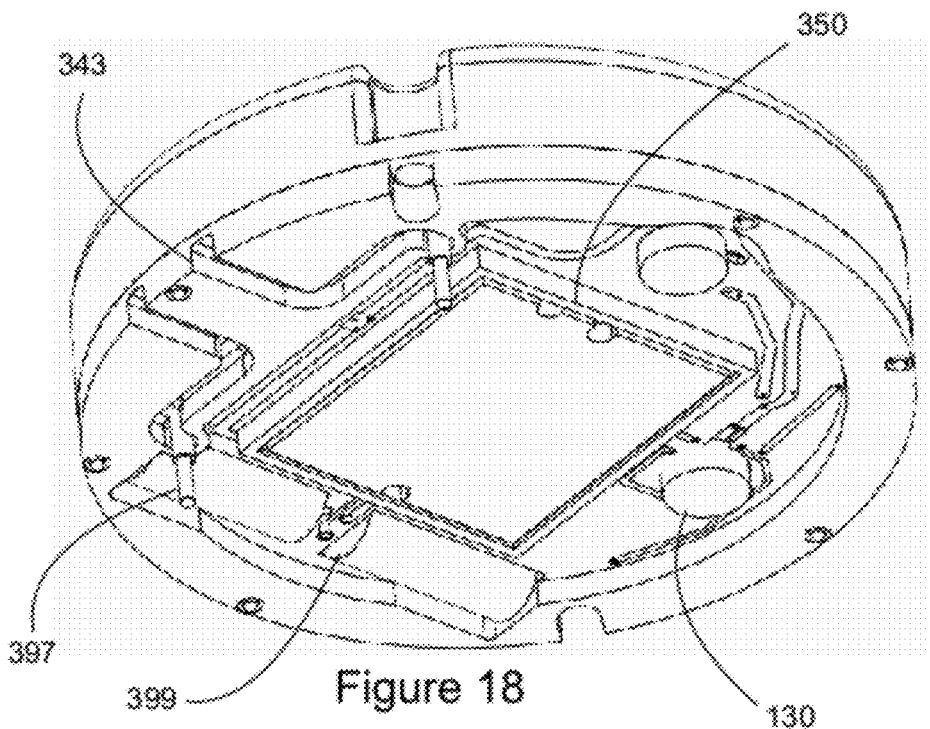
FIG. 18 illustrates a perspective view of an LED module with a thermal pad removed.
Figure 19:
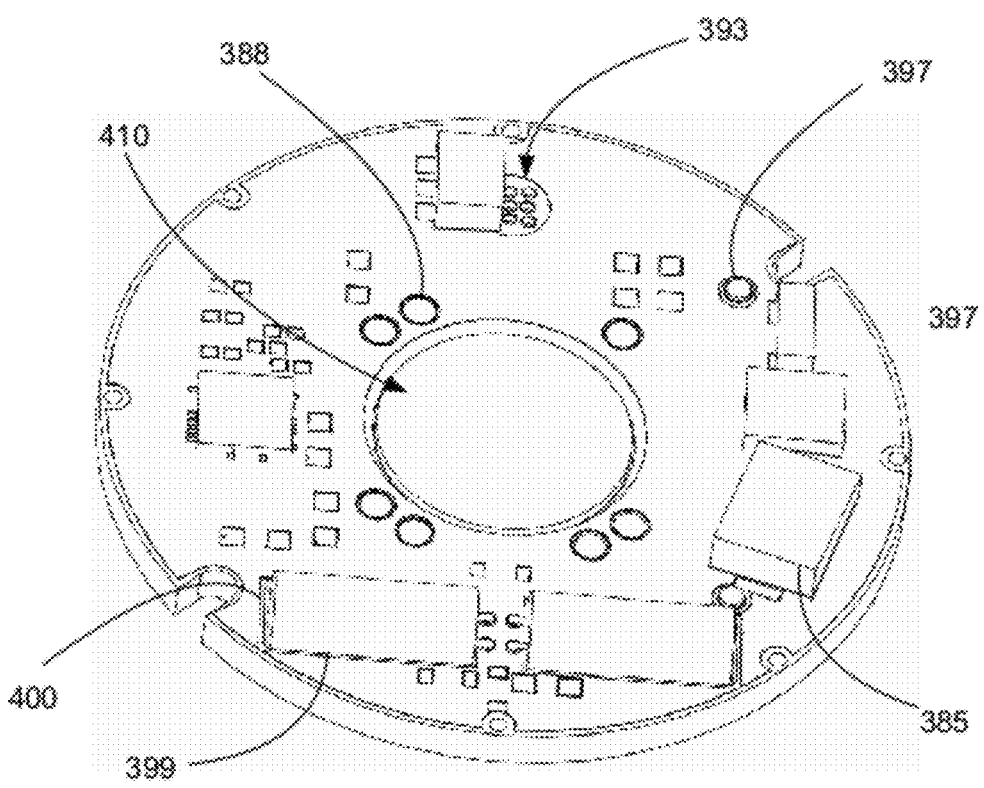
FIG. 19 illustrates another perspective view of the embodiment depicted in FIG. 18 with a cover removed.
Figure 20:
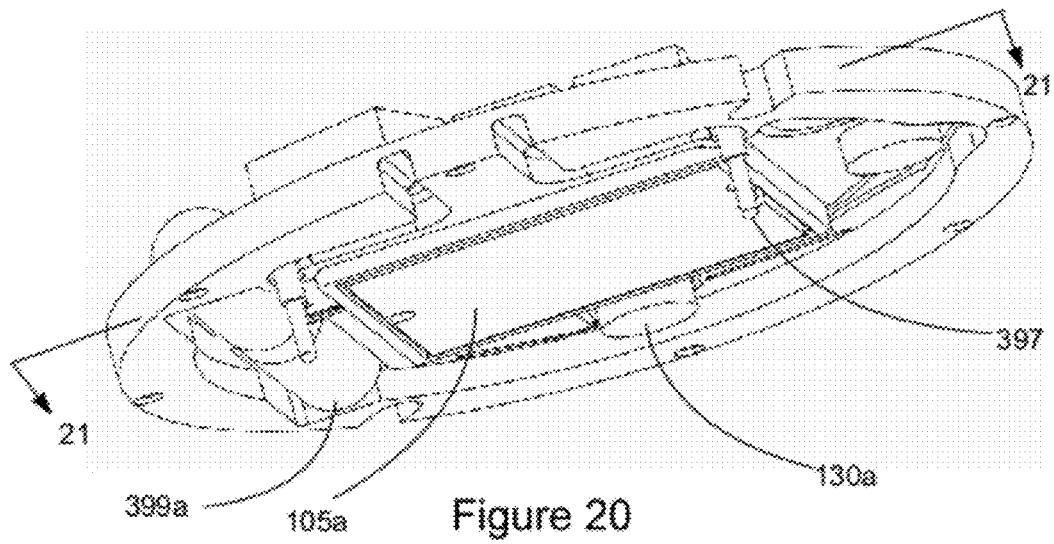
FIG. 20 illustrates another perspective view of the embodiment depicted in FIG. 18.
Figure 21:
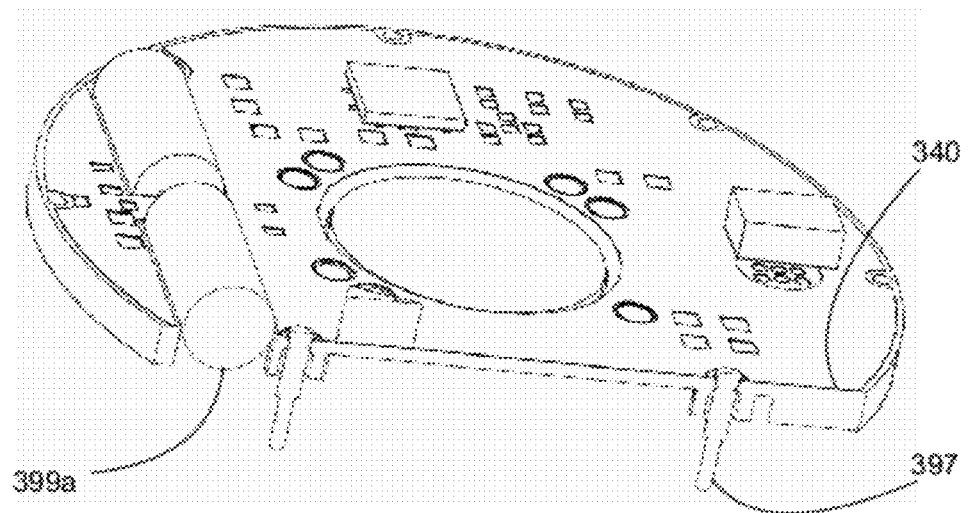
FIG. 21 illustrates a perspective view of a cross-section of the embodiment depicted in FIG. 20, taken along line 21-21.

FIGS. 14-15 illustrate an embodiment of a LED module 210 with a lens 295 that is configured to shape light emitted from the corresponding LED array. The construction of the LED module 210 can be substantially similar to the LED module 10 except for the increased height of the cover 260 to allow for the lens 295 that is suitable to shape the light into a desired pattern. Thus, circuitry 270 is provided on the base 240 that can be similar to the circuitry provided in LED module 10 (although with additional space, additional components can be added if desired) and a thermal pad 220. In either example, as can be appreciated, it would be possible to include an antenna and a wireless communication capable chip (such as a transceiver chip) that can receive and/or transmit commands via WI-FI or a ZIGBEE based protocol (or any other desirable protocol). Such a chip could be coupled to (or incorporated into) the controller and allow for wireless modification of the output of the LED module (e.g., to dim or turn the module on and off). Even with the taller embodiment that includes a light-shaping element such as lens 295, however, the volume of the module could be less than 40,000 mm$^3$.

Another embodiment of an LED module 310 is depicted in FIGS. 16-21. The LED module includes a base 340, a cover 360 and a lens 395. A thermal pad 320 is provided and optional power pins 397 extend below the thermal pad a distance than can be greater than 2 mm and more preferably more than 3 mm. It has been determined that such a construction can allow a socket (not shown) to be configured in a touch-safe manner such that an individual could safe place a finger in the socket without risking contact with a contact carrying a high voltage.

As can be appreciated, an optional channel 343 can be configured to receive a wire inserted into the channel (e.g., by including a conventional wire trap) such that the module can be easily assembled to a supporting surface and also easily be connected to a power source without the need to solder wires. In an embodiment the power pins could be omitted and the channel can include a trace that extends from the wire trap to the location where the trace can be coupled to a desired power supply position on the base 340.

The construction of the module 310 can be similar to the construction depicted above. For example, the base 340 is depicted with a socket 350 that receives an LED array (such as LED array 100) so that light block 410 can be position in a manner that allows for illumination to be emitted, however a lens is depicted as shaping the emitted light. The use of the lens tends to cause the LED module to grow in height and thus allows for more space to place circuitry inside the module. As discussed above, taps 388 allow for power to be selectively provided to different portions of the light block 410. Circuitry, as noted above, can include voltage suppressor 385, as well as controllers and communication chips (which can be provided separately or integrated together) that can be positioned near thermal vias 393, which can be aligned with a heat puck 130. The module 310 is also depicted as including capacitors 399. Capacitors tend to be larger in size then other components and can be somewhat sensitive to heat. Therefore, a bottom surface 130a of the heat puck 130, a bottom surface 105a of the substrate 105 and a bottom surface 399a of the capacitor 399 can be aligned so as to be substantially planar in orientation such that the thermal pad 320 is effective to provide acceptable thermal transfer between a supporting surface and the corresponding bottom surfaces. Thus, the capacitor 399 can be positioned in an aperture 400 that allows the capacitor 399 to readily connect electrically to components positioned on a first side of the base 340 while also extending to the thermal pad on a second side of the base.

As can be appreciated, therefore, features of the depicted design allow for a more compact LED module that provides desirable illumination characteristics and can accept AC line voltage as an input. Numerous other benefits of the embodiments depicted herein can also be appreciated, depending on the desired configuration.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

I claim:

1. An illumination module, comprising:
    a base with a first and second side and including a socket on the first side and an aperture on the second side, the socket in communication with an aperture, the base being insulative;
    a light emitting diode (LED) array having a substrate and a light block mounted on the substrate, the substrate positioned in the socket such that a light block extends into the aperture;
    a cover with an opening aligned with the light block, the cover mounted on the base, the cover having an angled surface positioned around the opening, the angled surface configured to be substantially non-reflective with respect to the light block; and
    a thermal pad positioned on the second side of the base and in thermal communication with the substrate.

2. The illumination module of claim 1, wherein the base supports circuitry that is configured to convert AC line voltage of at least 110 volts AC to DC voltage.

3. The illumination module of claim 2, wherein the module has a volume of not more than 35,000 mm³.

4. The illumination module of claim 3, wherein the volume of the module is less than 30,000 mm³.

5. An illumination module, comprising:
    a base with a first and second side and including a socket on the first side and an aperture on the second side, the socket in communication with an aperture, the base being insulative;
    a light emitting diode (LED) array having a substrate and a light block mounted on the substrate, the substrate positioned in the socket such that a light block extends into the aperture;
    a cover with an opening aligned with the light block, the cover mounted on the base;
    a thermal pad positioned on the second side of the base and in thermal communication with the substrate; and
    circuitry positioned on the base configured to receive AC line voltage and to power the LED array, wherein the module has a volume of not more than 40,000 mm³.

6. The illumination module of claim 5, wherein the circuitry is configured to selectively power different series of LEDs provided in the light block such that the illumination is free of flicker perceptible to a user.

7. The illumination module of claim 6, wherein the volume is not more than 35,000 m³.

8. The illumination module of claim 7, wherein the volume is not more than 30,000 m³.

9. The illumination module of claim 8, wherein the cover is configured to substantially avoid shaping light emitted from the LED array.

10. The illumination module of claim 5, wherein the circuitry includes a capacitor supported by the base, the capacitor positioned in an aperture such that a portion of the capacitor extends on both sides of the base.

11. The illumination module of claim 10, wherein the capacitor has a first bottom surface and the substrate a second bottom surface such that the first and second bottom surface are substantially planar.

12. The illumination module of claim 11, wherein the base further supports a heat puck with a third bottom surface, wherein the third bottom surface is substantially planar with second bottom surface.

13. The illumination module of claim 12, wherein the base includes a plurality of thermal vias configured to direct heat from the circuitry to the heat puck.

14. The illumination module of claim 5, wherein the illumination module is configured to emit more than 500 lumens.

* * * * *